US012753124B2

(12) United States Patent
Yamagishi et al.

(10) Patent No.: US 12,753,124 B2
(45) Date of Patent: Oct. 6, 2026

(54) CERAMIC, PROBE GUIDING MEMBER, PROBE CARD AND SOCKET FOR PACKAGE INSPECTION

(71) Applicant: FERROTEC MATERIAL TECHNOLOGIES CORPORATION, Tokyo (JP)

(72) Inventors: Wataru Yamagishi, Tokyo (JP); Kazumasa Mori, Tokyo (JP); Shunichi Eto, Tokyo (JP)

(73) Assignee: FERROTEC MATERIAL TECHNOLOGIES CORPORATION, Tokyo (JP)

( * ) Notice: Subject to any disclaimer, the term of this patent is extended or adjusted under 35 U.S.C. 154(b) by 1031 days.

(21) Appl. No.: 17/917,880

(22) PCT Filed: Apr. 8, 2021

(86) PCT No.: PCT/JP2021/014925
§ 371 (c)(1),
(2) Date: Mar. 7, 2023

(87) PCT Pub. No.: WO2021/206148
PCT Pub. Date: Oct. 14, 2021

(65) Prior Publication Data
US 2023/0312423 A1 Oct. 5, 2023

(30) Foreign Application Priority Data
Apr. 10, 2020 (JP) ................................. 2020-071158

(51) Int. Cl.
*C04B 35/584* (2006.01)
*C04B 35/48* (2006.01)
(Continued)

(52) U.S. Cl.
CPC ............ *C04B 35/584* (2013.01); *C04B 35/48* (2013.01); *G01R 1/0433* (2013.01);
(Continued)

(58) Field of Classification Search
CPC .................. C04B 35/584; C04B 35/48; C04B 2235/3244; C04B 2235/3873; C04B 2235/762
See application file for complete search history.

(56) References Cited

U.S. PATENT DOCUMENTS

2005/0130829 A1 6/2005 Etoh et al.
2020/0241047 A1 7/2020 Yamagishi et al.
2021/0188714 A1 6/2021 Yamagishi et al.

FOREIGN PATENT DOCUMENTS

JP 61-68374 A 4/1986
JP 64-5975 A 1/1989
(Continued)

OTHER PUBLICATIONS

JPS6433072A machine translation (Year: 1989).*
(Continued)

*Primary Examiner* — Cameron K Miller
(74) *Attorney, Agent, or Firm* — Birch, Stewart, Kolasch & Birch, LLP

(57) ABSTRACT

A ceramic containing, in mass %:
$Si_3N_4$: 20.0 to 60.0%,
$ZrO_2$: 25.0 to 70.0%,
at least one selected from SiC and AlN: 2.0 to 17.0%, where AlN is 10.0% or less,
at least one selected from MgO, $Y_2O_3$, $CeO_2$, CaO, $HfO_2$, $TiO_2$, $Al_2O_3$, $SiO_2$, $MoO_3$, CrO, CoO, ZnO, $Ga_2O_3$, $Ta_2O_5$, NiO and $V_2O_5$: 5.0 to 15.0%, wherein Fn calculated from the following equation (1) satisfies 0.02 to 0.40. This ceramic can be laser machined with high efficiency.

$$Fn=(SiC+3AlN)/(Si_3N_4+ZrO_2) \tag{1}$$

18 Claims, 2 Drawing Sheets

(51) Int. Cl.
*G01R 1/04* (2006.01)
*G01R 1/073* (2006.01)

(52) U.S. Cl.
CPC .. *G01R 1/07371* (2013.01); *C04B 2235/3244* (2013.01); *C04B 2235/3873* (2013.01); *C04B 2235/762* (2013.01); *C04B 2235/945* (2013.01); *C04B 2235/9607* (2013.01)

(56) References Cited

FOREIGN PATENT DOCUMENTS

| | | | | |
|---|---|---|---|---|
| JP | 64-33072 | A | | 2/1989 |
| JP | S6433072 | A | * | 2/1989 |
| JP | 2001-354480 | A | | 12/2001 |
| JP | 2003-286076 | A | | 10/2003 |
| JP | 2005-119941 | A | | 5/2005 |
| JP | 2010-180105 | A | | 8/2010 |
| WO | WO 2019/078364 | A1 | | 4/2019 |
| WO | WO 2019/093370 | A1 | | 5/2019 |

OTHER PUBLICATIONS

International Preliminary Report on Patentability and English translation of the Written Opinion of the International Searching Authority (Forms PCT/IB/326, PCT/IB/373 and PCT/ISA/237) for International Application No. PCT/JP2021/014925, dated Oct. 20, 2022.
International Search Report (Form PCT/ISA/210) for International Application No. PCT/JP2021/014925, dated Jun. 15, 2021, with English translation.
Yoshida et al., "Machining Characteristics of Ceramics in YAG Laser Irradiation", The 3rd Manufacturing & Machine Tool Conference, Japanese Society of Mechanical Engineers, Nov. 21, 2001, pp. 213-214 (3 pages total), with English abstract.

* cited by examiner

CERAMIC, PROBE GUIDING MEMBER, PROBE CARD AND SOCKET FOR PACKAGE INSPECTION

TECHNICAL FIELD

The present invention relates to ceramic, probe guiding member, probe card and socket for package inspection.

BACKGROUND ART

For example, a probe card is used in the inspection process of an IC chip. FIG. 1 shows a cross-sectional view illustrating the configuration of the probe card, and FIG. 2 shows a top view illustrating the configuration of the probe guide. As shown in FIG. 1, the probe card 10 is an inspection jig including a needle-shaped probe 11 and a probe guide (probe guiding member) 12 having a plurality of through holes 12*a* for conducting each probe 11. The inspection of the IC chip 14 is performed by bringing a plurality of probes 11 into contact with the IC chip 14 formed on the silicon wafer 13.

Patent Document 1 exemplifies a ceramic having a mixture of 25 to 60% by mass of silicon nitride and 40 to 75% by mass of boron nitride as a main raw material. Further, Patent Document 2 discloses an invention relating to free-machining ceramic, wherein the main component is 30 to 50% by mass of boron nitride and 50 to 70% by mass of zirconia.

With the recent miniaturization and higher performance of devices, the probe guides used in the inspection apparatus is needed to have a coefficient of thermal expansion similar to that of the silicon wafer 13, and the mechanical strength (flexural strength) that can withstand the probe load. It is also required to machine a large number of holes for a microprobe with high accuracy.

For example, an inspection efficiency of an inspection process on IC chips depends on how many probes can be brought into contact with IC chips at the same time. Hence, recent years have been seeing a practical application of a probe card on which tens of thousands of minute probes are set upright with high density by the micro-electromechanical systems (MEMS). As illustrated in FIG. 2 given above, the probe guide 12 needs to be provided with the through holes 12*a* at positions corresponding to the probes 11 of the probe card 10. Setting positions, a shape, and the like of the probes 11 of the probe card 10 vary according to specifications of the inspection apparatus, and setting positions, a shape, and the like of the through holes 12*a* vary accordingly. For example, in a case where the probes 11 have a pin shape, a circular hole is adapted for the through holes 12*a*, and the through holes 12*a* need to be formed in various shapes according to the shape of the probes 11.

An inner diameter of the holes and a pitch of the holes depend on a kind or an arrangement of the probes 11; for example, there is a case where round shape through holes having a diameter of 50 μm or 50 μm square through holes are arranged with a 60 μm pitch (a wall thickness between the through holes is about 10 μm). It is necessary to provide tens of thousands of such small through holes. This requires a material that facilitates precise machining. In particular, particles which could be produced when the through holes 12*a* of the probe guide 12 come into contact with the probes 11 may give rise to damage to the device, a poor inspection, and an increase in number of maintenance times of the probe card 10. Therefore, the through holes 12*a* of the probe guide 12 are also required to have inner surfaces with a low roughness, that is, smooth machined surfaces.

Here, with finer wiring of IC chips, there have been a tendency of an increase in the number of probes and a decrease in the distance (pitch) between pads to be in contact with the probes, and a need for further enhancement in positional precision of the probes. To support this narrow pitch, miniaturization of probes is in progress, and use of probes having various shapes has been started. At the same time, for a material used for the probe guide, there arise needs for decreasing its thickness, forming fine holes that are accommodated to changes in shapes of probes, and the like, for a purpose of improving the positional precision of the probes.

However, as a thickness of the material for the probe guide is reduced, a strength of the member is decreased, so that the probe guide cannot withstand a probe load to deform, and consequently, the positional precision of the probes decreases. Moreover, the material for the probe guide can be broken in some cases. To deal with these demands, the probe guide is required to have extremely excellent mechanical properties.

The above description is made mainly about the probe guide, and applications of which similar qualities are required include a socket for inspection such as a socket for package inspection.

The ceramics described in Patent Documents 1 and 2 cannot obtain sufficient mechanical strength (specifically, flexural strength of 600 MPa or more).

The present inventors also proposed in Patent Document 3, in order to smooth the processed surface formed by laser processing (for example, the inner surface of the through hole of the probe guide), the high-strength ceramic $Si_3N_4$ is used. $ZrO_2$ of expanded ceramic and predetermined oxides (at least one selected from MgO, $Y_2O_3$, $CeO_2$, CaO, $HfO_2$, $TiO_2$, $Al_2O_3$, $SiO_2$, $MoO_3$, CrO, CoO, ZnO, $Ga_2O_3$, $Ta_2O_5$, NiO and $V_2O_5$), and has a coefficient of thermal expansion similar to that of a silicon wafer, and a high-strength ceramic.

LIST OF PRIOR ART DOCUMENTS

Patent Document

[Patent Document 1] JP2001-354480
[Patent Document 2] JP2003-286076
[Patent Document 3] WO2019/093370

Non-Patent Literature

[Non-Patent Document 1] Takeshi Yoshida et al., Machining Characteristics of Ceramics in YAG Laser Irradiation, Academic Lecture 2001 of Production and Machining, 3rd Production Machining/Machine Tool Division Supporters Association, Japan Society of Mechanical Engineers, Nov. 21, 2001

SUMMARY OF INVENTION

Technical Problem

The invention of Patent Document 3 examines a case where laser processing is performed on a ceramic material in which $ZrO_2$ is composited with $Si_3N_4$, and appropriate amount of oxides such as MgO, $Y_2O_3$, $CeO_2$, CaO, $HfO_2$, $TiO_2$, $Al_2O_3$, $SiO_2$, $MoO_3$, CrO, CoO, ZnO, $Ga_2O_3$, $Ta_2O_5$, NiO and $V_2O_5$ are contained in order to smooth a processed surface formed by laser processing (for example, the inner surface of a through hole of a probe guide) However, there is no mention about machining speed.

Here, as described in Non-Patent Document 1, It is known to be easy, for example, when drilling is performed by irradiating a YAG laser, the ceramic of $ZrO_2$ alone is generally processed as compared with the ceramic of $Si_3N_4$ alone. Non-Patent Document 1 explains that the reason is that ceramic having a higher thermal conductivity require a larger irradiation energy.

However, according to the research by the present inventors, when laser processing is performed on ceramic in which $ZrO_2$ is scattered in $Si_3N_4$, it is difficult to process at the portion where $ZrO_2$ is present, and it is easy to process at the portion where $ZrO_2$ is not present, resulting in a difference in processing speed, and as a result, the processing speed was extremely reduced. It also occurs even on the ceramic containing predetermined oxides (at least one selected from MgO, $Y_2O_3$, $CeO_2$, CaO, $HfO_2$, $TiO_2$, $Al_2O_3$, $SiO_2$, $MoO_3$, CrO, CoO, ZnO, $Ga_2O_3$, $Ta_2O_5$, NiO and $V_2O_5$).

The present invention is capable of high-efficiency laser machining with a coefficient of thermal expansion similar to that of silicon, excellent mechanical strength and workability (high-precision fine machining, excellent machining surface properties, and suppression of particle generation). It is an object of the present invention to provide a certain ceramic, a probe guiding member using the ceramic, a probe card, and an inspection socket.

Solution to Problem

In order to achieve the above object, the present inventors have conducted intensive studies for the purpose of improving the processing speed of ceramic in which $ZrO_2$ and a predetermined oxide are combined with $Si_3N_4$.

When laser processing is performed on the above composite ceramic, the part where $ZrO_2$ is present is difficult to process, and the part where $ZrO_2$ is not present is easy to process. The inventers have studied, and it was considered that $ZrO_2$ has a high laser reflectance and lowered the laser absorption rate. Therefore, the present inventors have made extensive studies on compounds that reduce the laser reflectance of the composite ceramic, and by allowing appropriate amounts of SiC and AlN to be present according to the amounts of $Si_3N_4$ and $ZrO_2$, basically. It has been found that the processing speed of a laser can be improved without deteriorating the performance (coefficient of thermal expansion similar to that of silicon, excellent mechanical strength and workability).

The present invention has been made based on the above findings, and the following inventions are the gist of the present invention.

A ceramic containing, in mass %:

$Si_3N_4$: 20.0 to 60.0%, $ZrO_2$: 25.0 to 70.0%, at least one selected from SiC and AlN: 2.0 to 17.0%, where AlN is 10.0% or less, at least one selected from MgO, $Y_2O_3$, $CeO_2$, CaO, $HfO_2$, $TiO_2$, $Al_2O_3$, $SiO_2$, $MoO_3$, CrO, CoO, ZnO, $Ga_2O_3$, $Ta_2O_5$, NiO and $V_2O_5$: 5.0 to 15.0%, wherein Fn calculated from the following equation (1) satisfies 0.02 to 0.40.

$$Fn=(SiC+3AlN)/(Si_3N_4+ZrO_2) \quad (1)$$

Advantageous Effects of Invention

According to the present invention, the coefficient of thermal expansion similar to that of silicon, excellent mechanical strength and workability (high-precision fine processing, excellent processing surface texture, suppression of particle generation), and high-efficiency laser processing are achieved. Since possible ceramic can be obtained, it is particularly useful as a probe guiding member, probe card and inspection socket.

DESCRIPTION OF EMBODIMENTS

1. Ceramic

Figure 1:
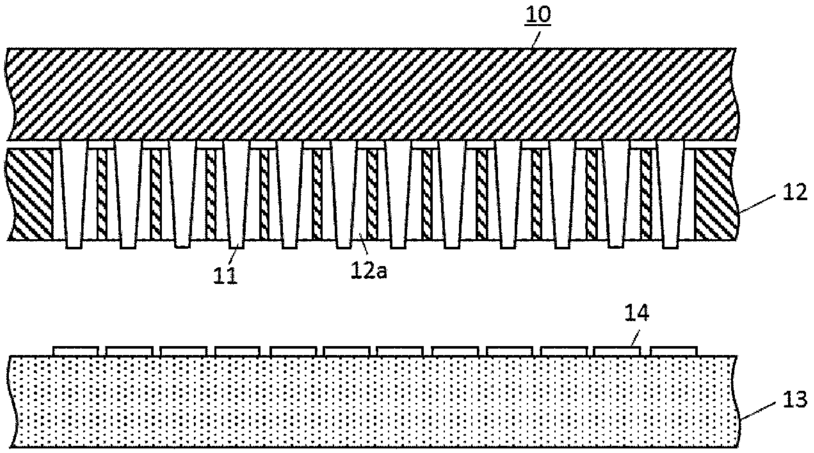
FIG. 1 is a cross-sectional view illustrating the configuration of a probe card.
Figure 2:
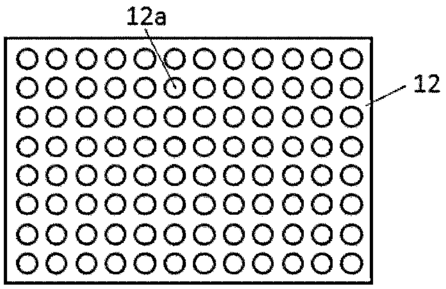
FIG. 2 is a top view illustrating the configuration of a probe guide.
Figure 3:
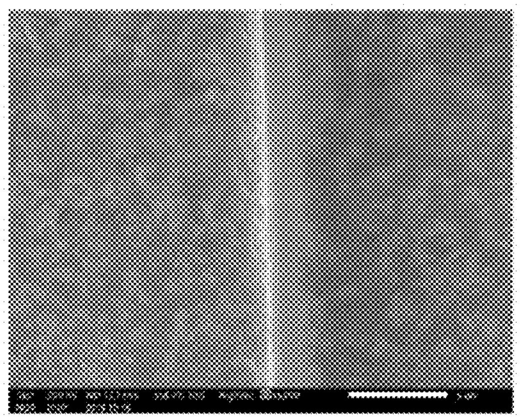
FIG. 3 is a photograph of the hole after micromachinability of Example 2 taken from above.

The ceramic according to the present invention contains, in mass %:

$Si_3N_4$: 20.0 to 60.0%, $ZrO_2$: 25.0 to 70.0%, at least one selected from SiC and AlN: 2.0 to 17.0%, where AlN is 10.0% or less, at least one selected from MgO, $Y_2O_3$, $CeO_2$, CaO, $HfO_2$, $TiO_2$, $Al_2O_3$, $SiO_2$, $MoO_3$, CrO, CoO, ZnO, $Ga_2O_3$, $Ta_2O_5$, NiO and $V_2O_5$: 5.0 to 15.0%, wherein Fn calculated from the following equation (1) satisfies 0.02 to 0.40.

$$Fn=(SiC+3AlN)/(Si_3N_4+ZrO_2) \quad (1)$$

$Si_3N_4$: 20.0 to 60.0%

$Si_3N_4$ is effective for improving high strength of ceramic, and in order to obtain a high flexural strength of 700 MPa or more, it is necessary to contain 20.0% or more. However, when the content of $Si_3N_4$ exceeds 60.0%, it becomes difficult to obtain coefficient of thermal expansion similar to that of a silicon wafer, that is, it is difficult to obtain a coefficient of thermal expansion at −50 to 500° C. of $3.0\times10^{-6}$/° C. or more. Therefore, the content of $Si_3N_4$ is 20.0 to 60.0%. The lower limit is preferably set 25.0%, more preferably 30.0%. The upper limit is preferably set 55.0%, more preferably 50.0%.

$ZrO_2$: 25.0 to 70.0%

$ZrO_2$ is effective for improving high coefficient of thermal expansion of ceramic, and it is necessary to be contained 25.0% or more. However, when the content of $ZrO_2$ exceeds 70.0%, the coefficient of thermal expansion becomes too high, and it becomes difficult to obtain a coefficient of thermal expansion similar to that of a silicon wafer, that is, it is difficult to obtain a coefficient of thermal expansion at −50 to 500° C. of $6.0\times10^{-6}$/° C. or less. Therefore, the content of $ZrO_2$ is set to 25.0 to 70.0%. The lower limit is preferably set 30.0%, more preferably 35.0%. The upper limit is preferably set 65.0%, more preferably 60.0%.

Some $ZrO_2$ have a crystalline structure being a monoclinic crystal, a tetragonal crystal, or a cubic crystal. Since the monoclinic $ZrO_2$ has a lower strength than the tetragonal or cubic $ZrO_2$, it is preferable that the ratio of the monoclinic $ZrO_2$ to the entire $ZrO_2$ is as small as possible even when the monoclinic $ZrO_2$ is contained as a crystal structure. If the ratio of monoclinic crystals is too large, it will be difficult to achieve a flexural strength of 600 MPa. Therefore, the ratio of monoclinic crystals to the entire $ZrO_2$ is preferably 10% or less, and 5% or less. More preferably, it may be 0%. Further, in general in order to give a high strength to a $ZrO_2$ ceramic, a tetragonal crystal $ZrO_2$ with several percent of oxides dissolved therein is preferably used. However, if this tetragonal crystal $ZrO_2$ is exposed for a long time, the tetragonal crystal undergoes phase transition to a monoclinic crystal even when the exposure occurs at a low temperature (less than 200° C.), and this phase transition changes dimensions of the ceramic. For example, this phase transition proceeds at 40° C. or more, and proceeds more significantly at 150° C. or more. Therefore, if such a ceramic is used for a probe guiding member that guides probes of a probe card, the probe guiding member fulfills a function of a probe guiding member at room temperature, whereas as a temperature range for use increases, positions of a plurality of through holes and/or slits through which probes are to be inserted may deviate to inhibit the insertion of the probes. For that reason, it is more preferable to use a cubic crystal $ZrO_2$, which does not undergo the phase transition, that is, does not change the dimensions in a use temperature. Note that the cubic crystal $ZrO_2$ contains about 3 mol % of elements such that Y, and the content of $ZrO_2$ also includes an amount of these elements.

At least one selected from SiC and AlN: 2.0 to 17.0%, where AlN is 10.0% or less, $$Fn=(SiC+3AlN)/(Si_3N_4+ZrO_2):0.02 \text{ to } 0.40$$

As described above, although $ZrO_2$ is effective in imparting a high coefficient of thermal expansion to ceramic, both $Si_3N_4$ and $ZrO_2$ have low thermal conductivity, so that the processing speed by the laser is lowered. Pulse laser machining, which is a non-thermal machining method, is used for precision machining of ceramic. Pulsed laser machining is a method of machining ceramic without melting them, but there is a heat-affected region that is heated by the influence of heat during machining at a site near the laser irradiation position. As the size of the through hole provided by processing becomes smaller, the laser diameter becomes larger with respect to the diameter of the through hole, the heat-affected zone becomes relatively larger, and defects such as shape defects and reattachment of the removed material are likely to occur. Therefore, in order to process ceramic with low thermal conductivity so that shape defects do not occur, it is necessary to adjust laser output (W), scanning trajectory (laser movement, mileage), scanning speed, and repetition frequency (time interval of pulse laser irradiation) and so on. For example, if the repetition frequency is made small, the temperature rise of the ceramic can be suppressed, but on the other hand, the time required for processing becomes long. As a result, the processing speed of the laser is reduced.

Here, SiC and AlN have extremely high thermal conductivity as compared with $Si_3N_4$ and $ZrO_2$. Therefore, in ceramic in which $ZrO_2$ and a predetermined oxide are composited with $Si_3N_4$, if one or more of SiC and AlN are contained, it is easy to dissipate heat in the heat-affected region generated during laser processing, which is basic. The processing speed of the laser can be improved without deteriorating the performance (coefficient of thermal expansion similar to that of silicon, excellent mechanical strength and workability). Therefore, 2.0% or more of one or more selected from SiC and AlN is contained. Further, in order to obtain the above effect, it is necessary to set (SiC+3AlN)/($Si_3N_4$+$ZrO_2$) to 0.02 or more. On the other hand, if the amounts of SiC and AlN are too large, the flexural strength is lowered. Therefore, the content of one or more types selected from SiC and AlN is set to 17.0% or less (however, AlN is 10.0% or less). Further, (SiC+3AlN)/($Si_3N_4$+$ZrO_2$) is set to 0.40 or less.

Here, since SiC and AlN have lower flexural strengths than $Si_3N_4$ and $ZrO_2$, especially when these compounds are present in the sintered body as coarse particles, the bending of the sintered body is performed. May reduce strength. Therefore, it is desirable that these compounds are uniformly dispersed in a size of 5.0 um or less in average particle size. It is more desirable that the average particle size is 2.0 um or less and the particles are uniformly dispersed. In order to realize this, it is preferable to use a raw material powder having a fine particle size, and as the raw material powder, a powder having an average particle size of 3.0 um or less is preferable, and a powder having an average particle size of 1.0 um or less is more preferable.

One or More Oxides Selected from MgO, $Y_2O_3$, $CeO_2$, CaO, $HfO_2$, $TiO_2$, $Al_2O_3$, $SiO_2$, $MoO_3$, CrO, CoO, ZnO, $Ga_2O_3$, $Ta_2O_5$, NiO, and $V_2O_5$: 5.0 to 15.0%

In a case where the ceramic according to the present invention is used to various applications, the ceramic needs to be subjected to fine machining. For example, in order to use the ceramic as a probe guiding member, a plurality of through holes and/or slits need to be formed. However, since the ceramic according to the present invention is a high hardness material containing $Si_3N_4$ and $ZrO_2$ as main components, it is difficult to perform this fine machining by mechanical work. Its machined surfaces (e.g., inner surfaces of the through holes of the probe guide) are therefore rough, and when a member subjected to such work is used, particles are produced, which incur damage to various devices or poor inspection. For that reason, it is preferable to perform the fine machining on this ceramic by laser beam machining, but it is difficult even for the laser beam machining to smooth the machined surfaces (e.g., the inner surfaces of the through holes of the probe guide), and it is difficult to completely prevent particles from being produced in the use of the ceramic.

Hence, the ceramic according to the present invention is made to contain a proper amount of oxides in order to smooth the processed surface formed by laser processing (for example, the inner surface of the through hole of the probe guide). That is, one or more oxides selected from MgO, $Y_2O_3$, $CeO_2$, CaO, $HfO_2$, $TiO_2$, $Al_2O_3$, $SiO_2$, $MoO_3$, CrO, CoO, ZnO, $Ga_2O_3$, $Ta_2O_5$, NiO, and $V_2O_5$ need to be contained at 5.0% or more. In contrast, if a content of these oxides is excessive, these oxides incur a decrease in flexural strength, and accordingly, the content of one or more of these oxides is to be 15.0% or less. Therefore, the content of one or more oxides selected from MgO, $Y_2O_3$, $CeO_2$, CaO, $HfO_2$, $TiO_2$, $Al_2O_3$, $SiO_2$, $MoO_3$, CrO, CoO, ZnO, $Ga_2O_3$, $Ta_2O_5$, NiO, and $V_2O_5$ is to range from 5.0 to 15.0%. A lower limit of the content is preferably 7.0%, and more preferably 9.0%. An upper limit of the content is preferably 13.0%, and more preferably 11.0%.

In particular, MgO, $Y_2O_3$, $CeO_2$, CaO, and $HfO_2$ each act as a sintering agent as well as the above effect and are additionally effective for stabilizing the crystalline structure of $ZrO_2$ in a form of the cubic crystal. $TiO_2$, $Al_2O_3$, $SiO_2$, $MoO_3$, CrO, CoO, ZnO, $Ga_2O_3$, $Ta_2O_5$, NiO, and $V_2O_5$ each act as a sintering agent as well as the above effect. Therefore, it is preferable for the ceramic to contain one or more oxides selected from MgO, $Y_2O_3$, $CeO_2$, CaO, and $HfO_2$, and one or more oxides selected from $TiO_2$, $Al_2O_3$, $SiO_2$, $MoO_3$, CrO, CoO, ZnO, $Ga_2O_3$, $Ta_2O_5$, NiO, and $V_2O_5$.

Contents of the respective components (mass %) can be measured by the ICP emission spectral analysis. Note that no specific limitation is imposed on the balance other than the components described above, but it is preferable to reduce the balance as much as possible, and a content of the balance is preferably 10.0% or less, more preferably 5.0% or less, and may be 0%. Examples of the balance include BN, and the like. Especially, BN may deteriorate strength and its amount should be as low as possible. It is preferably set 3.0% or less, more preferably 1.5% or less.

Coefficient of Thermal Expansion at −50 to 500° C.: $3.0\times10^{-6}$ to $6.0\times10^{-6}$/° C.

In a case where the ceramic according to the present invention is used for a probe guide, the ceramic is required to have a coefficient of thermal expansion as high as that of a silicon wafer on which IC chips are formed. This is because, when a temperature in the inspection changes, positions of the IC chips move with thermal expansion of the silicon wafer. At the time, in a case where the probe guide has a coefficient of thermal expansion as high as that of the silicon wafer, the probe guide moves in synchronization with expansion and contraction of the silicon wafer, which enables a high precision inspection to be kept. This also applies to a case where the ceramic according to the present invention is used for a socket for inspection. Accordingly, a reference coefficient of thermal expansion at −50 to 500° C. is $3.0\times10^{-6}$ to $6.0\times10^{-6}$/° C.

Flexural Strength: 600 MPa or More

In a case where the ceramic according to the present invention is used for a probe guide, the ceramic is required to have mechanical properties sufficient to withstand contact and a load of probes and the like in the inspection. In particular, the ceramic is required to have a flexural strength that is higher than ever before, in order to meet a demand for reductions of size and thickness of probe guides. This also applies to a case where the ceramic according to the present invention is used for a socket for inspection. Accordingly, a reference flexural strength is 600 MPa or more, and more preferably 700 MPa or more.

Micromachinability

Regarding micromachinability, a machining precision of pulse laser machining performed on a ceramic material having a thickness of 0.3 mm to form nine 50-μm-square through holes or nine 30-μm-square through holes is evaluated.

In detail, the evaluation is carried out by obtaining images taken with optical microscope (for example, VHX7000 manufactured by Keyence Co., Ltd.), and by observing the obtained images with an image measuring machine (for example, Quick Vision manufactured by Mitutoyo Co., Ltd.).

Observing the shapes of the holes on a side to which laser beams come out, it is evaluated as good micromachinability if machining precision falls within ±2 μm (for a 50 μm square through hole, the length of one side is 48 to 52 μm, and for a 30 μm square through hole, the length of one side is 28 to 32 μm), and corner R of each square hole measured in a circle from any three points is 5 um or less.

A processing speed is evaluated by measuring the time from the start to the end of the formation of the through holes when the nine through holes are machined at the maximum speed at which the above-mentioned good fine workability can be maintained, and calculating the ratio ($t_1/t_0$) of the processing time ($t_1$) of the ceramic to the processing time ($t_0$) of the ceramic having the standard composition. It is considered that the case where the ratio ($t_1/t_0$) is 1.05 or more is good. When it is 1.10 or more, and further, 1.15 or more, it is evaluated that the processing speed is further excellent. The reference composition means ceramic having a composition excluding SiC and AlN under the condition that the ratio of $Si_3N_4$ and $ZrO_2$ is constant from the ceramic to be evaluated.

As described above, the smaller the size of the through hole provided by processing, the larger the laser diameter with respect to the diameter of the through hole, and the relatively large heat-affected zone causes problems such as shape defects and reattachment of the removed material. It will be easier to do. Therefore, the effect of the present invention becomes more remarkable as the size of the through hole becomes smaller. Specifically, the ceramic of the present invention has a through hole or slit having an inscribed circle diameter of 100 μm or less, more preferably a through hole or slit having an inscribed circle diameter of 50 μm or less, and even more preferably an inner circle. It is useful for manufacturing probe guiding member having through holes or slits having a tangent circle diameter of 30 μm or less. The diameter of the inscribed circle of the slit is synonymous with the width of the slit. Further, the thicker the ceramic, the longer it takes to form the through hole, and the heat-affected region becomes relatively large. Therefore, the ceramic of the present invention is useful to manufacture a probe guiding member in which the ratio of the diameter of the inscribed circle (depth/diameter of the inscribed circle) to the depth of the through hole is 6.0 or more, particularly 10.0 or more.

Roughness of Machined Surface

Regarding a roughness of the machined surface, nine 50-μm square through holes are formed on a ceramic material having a thickness of 0.3 mm by the pulse laser machining, given five visual fields of inner surfaces of the machined holes are measured over a length of 100 μm or more under a laser confocal microscope (VK-X150 from KEYENCE CORPORATION), skew correction is performed to calculate Ra, and an average value of Ra is evaluated. Ra being 0.25 μm or less is rated as good.

Occurrence of Crack after Heat Treatment at 150° C.

Regarding occurrence of a crack after heat treatment at 150° C., a ceramic material having a thickness 0.3 mm is heated from room temperature to 150° C. at 5° C./min, retained at 150° C. for 100 hours, then allowed to be naturally cooled at room temperature, and after being left still for 5 hours since a temperature of the ceramic reaches the room temperature, five or more visual fields of the ceramic are captured under a digital microscope (VHX-6000 from KEYENCE CORPORATION) at 200× observation magnification, and from captured images, whether a crack occurs is evaluated.

2. Ceramic Manufacturing Method

Hereinafter, an example of a method for manufacturing ceramic according to the present invention will be described.

$Si_3N_4$ powder, $ZrO_2$ powder, SiC and/or AlN powder, and one or more oxide powders selected from MgO, $Y_2O_3$, $CeO_2$, CaO, $HfO_2$, $TiO_2$, $Al_2O_3$, $SiO_2$, $H_2MoO_4$ (to be $MoO_3$ after sintering), CrO, CoO, ZnO, $Ga_2O_3$, $Ta_2O_5$, NiO, and $V_2O_5$ are mixed by a known method such as one using a ball mill. That is, the powders, solvent, resin-made balls each including a ceramic-made or iron-made core therein are mixed in a container to be formed into slurry. At that time, as the solvent, water or alcohol can be used. In addition, an additive such as a dispersant and a binder may be used as necessary.

The obtained slurry is formed into grains by a known method such as spray drying and a method using a decompression evaporator. That is, the slurry is spray-dried by a spray dryer to be formed into granules or is dried by the decompression evaporator to be formed into powder.

The obtained powder is sintered under a high temperature and a high pressure by, for example, a known method such as hot pressing and hot isostatic pressing (HIP) to be formed into a sintered ceramic body. In the case of the hot pressing, the powder may be calcined in a nitrogen atmosphere. In addition, a temperature of the calcination is to range from 1300 to 1800° C. If the temperature is excessively low, the sintering becomes insufficient, and if the temperature is excessively high, a problem such as liquating oxide components arises.

An appropriate pressing force range from 10 to 50 MPa. In addition, a duration of maintaining the pressing force is normally about 1 to 4 hours, which however depends on the temperature or the dimensions. Also, in a case of the HIP, calcination conditions including the temperature and the pressing force are to be set as appropriate. Alternatively, a known calcination method such as a pressure less calcination method and an atmosphere pressing calcination may be adopted.

Example

In order to confirm the effects of the present invention, $Si_3N_4$ powder, $ZrO_2$ powder, SiC and/or AlN powder, and one or more oxide powders selected from MgO, $Y_2O_3$, $Al_2O_3$, $SiO_2$, $CeO_2$, $TiO_2$, and $H_2MoO_4$ (to be $MoO_3$ after sintering) were mixed at various compounding ratios with water, dispersant, resin, and ceramic-made balls, and obtained slurries were each spray-dried by a spray dryer to be formed into granules. The obtained granules were charged into a graphite-made dice (mold) and subjected to hot pressing calcination in a nitrogen atmosphere, under a pressure of 30 MPa, at 1700° C., for 2 hours, to be formed into test materials being 150 mm long×150 mm wide×30 mm thick.

From the obtained test materials, test specimens were taken and subjected to various kinds of tests.

<Thermal Expansivity>

A coefficient of thermal expansion of each of the test materials at −50 to 500° C. was determined in conformity with JIS R1618. A reference coefficient of thermal expansion at −50 to 500° C. is $3.0\times10^{-6}$ to $6.0\times10^{-6}$/° C.

<Flexural Strength>

A three-point flexural strength of each of the test materials was determined in conformity with JIS R1601. A reference flexural strength is 600 MPa or more.

<Relative Density>

A bulk density of each of the test materials was determined in conformity with JIS C2141, and the determined bulk density was divided by a theoretical density, by which a relative density was determined. A reference relative density is 95% or more.

<Young's Modulus>

A Young's modulus of each of the test materials was determined in conformity with JIS R1602. A reference Young's modulus is 240 GPa or more.

<Micromachinability>

Regarding micromachinability, a machining precision of pulse laser machining performed on a ceramic material having a thickness of 0.3 mm to form nine 50-μm-square through holes or nine 30-μm-square through holes is evaluated.

In detail, the evaluation is carried out by obtaining images taken with optical microscope (for example, VHX7000 manufactured by Keyence Co., Ltd.), and by observing the obtained images with an image measuring machine (for example, Quick Vision manufactured by Mitutoyo Co., Ltd.). A pulse laser having a wavelength of 1064 nm was used for processing a 50 μm square through hole, and a pulse laser having a wavelength of 532 nm was used for processing a 30 μm square through hole.

Figure 4:
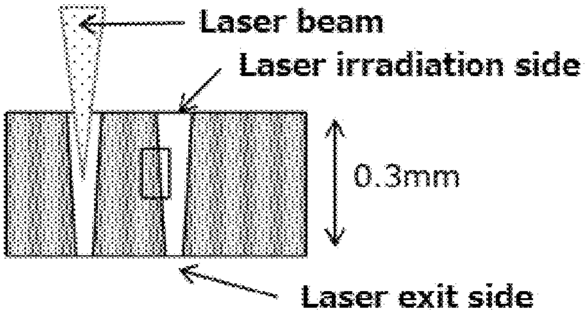
FIG. 4 is a schematic view of a state at the time of laser processing.

Observing the shapes of the holes on a side to which laser beams come out, it is evaluated as good micromachinability if machining precision falls within ±2 μm, corner R of each square hole measured in a circle from any three points is 5 um or less and there is no deposit. When the micromachinability is good, it is marked with "○", and in other cases (when there is residual material, when there is shape distortion, etc.), it is marked with "x". Note, FIG. 4 shows a schematic view of a state at the time of laser processing. As illustrated in FIG. 4, a side of a ceramic to be irradiated with laser light will be referred to as a laser irradiation side, and a side of the ceramic opposite to the laser irradiation will be referred to as a laser beam coming-out side.

<Processing Speed>

A processing speed is evaluated by measuring the time from the start to the end of the formation of the nine through holes, and calculating the ratio ($t_1/t_0$) of the processing time ($t_1$) of the ceramic to the processing time ($t_0$) of the ceramic having the standard composition. It is considered that the case where the ratio ($t_1/t_0$) is 1.05 or more is good. When it is 1.10 or more, and further, 1.15 or more, it is evaluated that the processing speed is further excellent. The reference composition means ceramic having a composition excluding SiC and AlN under the condition that the ratio of $Si_3N_4$ and $ZrO_2$ is constant from the ceramic to be evaluated.

<Roughness of Processed Surface>

Regarding a roughness of the machined surface, nine 50-μm square through holes were formed on the ceramic material having a thickness of 0.3 mm by the pulse laser machining, given five visual fields of inner surfaces of the machined holes were measured over a length of 100 μm or more under a laser confocal microscope (VK-X150 from KEYENCE CORPORATION), skew correction was performed to calculate Ra, and an average value of Ra was evaluated. Ra being 0.25 μm or less was rated as good. The roughness of the machined surface is determined by observing a cross section of the ceramic material parallel to a thickness direction of the ceramic material in an area including a thickness center portion of an inner surface of each hole (specifically, a portion surrounded by a rectangle illustrated in FIG. 8).

<Occurrence of Crack after Heat Treatment at 150° C.>

Regarding occurrence of a crack after heat treatment at 150° C., a ceramic material having a thickness 0.3 mm is heated from room temperature to 150° C. at 5° C./min, retained at 150° C. for 100 hours, then allowed to be naturally cooled at room temperature, and after being left still for 5 hours since a temperature of the ceramic reaches the room temperature, five or more visual fields of the ceramic are captured under a digital microscope (VHX-6000 from KEYENCE CORPORATION) at 200× observation magnification, and from captured images, whether a crack occurs is evaluated. A case where no crack occurs is rated as ○, and a case where a crack occurs is rated as x.

TABLE 1

| Classification | | Basic Composition | Composition(mass %) Main Composition $Si_3N_4$ | $ZrO_2$ | SiC | AlN | Others | SiC + AlN Total | Oxide 1 MgO | $Y_2O_3$ | $CeO_2$ | Oxide 2 $Al_2O_3$ | $SiO_2$ | $TiO_2$ | $MoO_3$ | Total | Fn |
|---|---|---|---|---|---|---|---|---|---|---|---|---|---|---|---|---|---|
| Example | 1 | Comparative example 1 | 40.3 | 50.8 | 2.1 | — | — | 2.1 | 0.9 | 3.7 | — | 1.9 | — | 0.3 | — | 6.8 | 0.02 |
| | 2 | Comparative example 1 | 37.9 | 47.9 | 7.4 | — | — | 7.4 | 0.9 | 3.7 | — | 1.9 | — | 0.3 | — | 6.8 | 0.09 |
| | 3 | Comparative example 3 | 20.4 | 64.6 | 5.6 | — | — | 5.6 | 2.7 | — | 2.7 | 0.9 | 2.7 | 0.2 | 0.2 | 9.4 | 0.07 |
| | 4 | Comparative example 4 | 44.6 | 26.8 | 15.3 | — | — | 15.3 | 4.1 | 3.0 | — | 2.5 | 2.5 | 1.2 | — | 13.3 | 0.21 |
| | 5 | Comparative example 5 | 50.8 | 28.9 | 4.1 | 8.2 | — | 12.3 | 2.6 | 2.0 | — | 1.2 | 1.0 | 1.2 | — | 8.0 | 0.36 |
| | 6 | Comparative example 6 | 40.3 | 40.8 | — | 9.6 | — | 9.6 | 2.2 | 4.5 | — | 2.0 | 0.4 | 0.2 | — | 9.3 | 0.36 |
| Comparative example | 1 | — | 41.2 | 52.0 | — | — | — | 0.0* | 0.9 | 3.7 | — | 1.9 | — | 0.3 | — | 6.8 | 0.00* |
| | 2 | Comparative example 1 | 40.9 | 51.6 | 0.7 | — | — | 0.7* | 0.9 | 3.7 | — | 1.9 | — | 0.3 | — | 6.8 | 0.01* |
| | 3 | — | 21.7 | 68.9 | — | — | — | 0.0* | 2.7 | — | 2.7 | 0.9 | 2.7 | 0.2 | 0.2 | 9.4 | 0.00* |
| | 4 | — | 54.1 | 32.6 | — | — | — | 0.0* | 4.1 | 3.0 | — | 2.5 | 2.5 | 1.2 | — | 13.3 | 0.00* |
| | 5 | — | 58.6 | 33.4 | — | — | — | 0.0* | 2.6 | 2.0 | — | 1.2 | 1.0 | 1.2 | — | 8.0 | 0.00* |
| | 6 | — | 45.1 | 45.6 | — | — | — | 0.0* | 2.2 | 4.5 | — | 2.0 | 0.4 | 0.2 | — | 9.3 | 0.00* |
| | 7 | Comparative example 6 | 35.5 | 35.8 | 12.2 | 7.2 | — | 19.4* | 2.2 | 4.5 | — | 2.0 | 0.4 | 0.2 | — | 9.3 | 0.47* |
| | 8 | Comparative example 6 | 38.1 | 38.6 | 5.0 | 9.0 | — | 14.0 | 2.2 | 4.5 | — | 2.0 | 0.4 | 0.2 | — | 9.3 | 0.43* |
| | 9 | — | —* | —* | 97.0* | — | BN: 3.0 | 97.0* | — | — | — | — | — | — | — | 0.0* | — |
| | 10 | — | 95.8* | —* | — | — | — | 0.0* | — | 3.1 | — | 1.1 | — | — | — | 4.2* | — |
| | 11 | — | —* | —* | — | 94.0* | — | 94.0* | — | 6.0 | — | — | — | — | — | 6.0 | — |
| | 12 | — | —* | 100.0* | — | — | — | 0.0* | — | — | — | — | — | — | — | 0.0* | — |

*It means outside the scope defined in the present invention.

TABLE 2

| Classification | | Coefficient of Thermal Expansion ($\times 10^{-6}$/° C.) | Flexural Strength (MPa) | Relative Density (%) | Young's Modulus (GPa) | Evaluation of formation square micro-holes | Crack after heat treatment at 150° C. |
|---|---|---|---|---|---|---|---|
| Example | 1 | 4.1 | 913 | 98.1 | 276 | ○ | ○ |
| | 2 | 3.8 | 866 | 97.8 | 285 | ○ | ○ |
| | 3 | 5.3 | 844 | 97.1 | 293 | ○ | ○ |
| | 4 | 3.3 | 727 | 98.2 | 286 | ○ | ○ |
| | 5 | 3.4 | 739 | 96.8 | 266 | ○ | ○ |
| | 6 | 3.9 | 763 | 96.9 | 245 | ○ | ○ |
| Comparative example | 1 | 4.3 | 904 | 98.3 | 259 | ○ | ○ |
| | 2 | 4.2 | 842 | 98.0 | 276 | ○ | ○ |
| | 3 | 5.6 | 828 | 96.9 | 306 | ○ | ○ |
| | 4 | 3.4 | 941 | 95.3 | 275 | ○ | ○ |
| | 5 | 3.2 | 886 | 97.7 | 278 | ○ | ○ |
| | 6 | 3.4 | 764 | 98.3 | 270 | ○ | ○ |
| | 7 | 4.0 | 549# | 98.4 | 283 | ○ | ○ |
| | 8 | 4.1 | 571# | 96.7 | 266 | ○ | ○ |
| | 9 | 3.6 | 426# | 95.3 | 381 | ○ | ○ |
| | 10 | 1.7# | 785 | 97.6 | 285 | ○ | ○ |
| | 11 | 4.4 | 348# | 98.7 | 320 | x Remaining material | ○ |
| | 12 | 8.0# | 880 | 97.8 | 245 | x Remaining material | x |

#It means that it does not have the performance desired in the present invention.

TABLE 3

| Classification | | Basic Composition | Machining speed evaluation: Machining speed rate compared with Basic Composition, 50 um square | Machining speed evaluation: Machining speed rate compared with Basic Composition, 30 um square | Inner surface roughness of hole Ra (um), 50 um square | Inner surface roughness of hole Ra (um), 30 um square | Evaluation of Micromachinability, 50 um square | Evaluation of Micromachinability, 30 um square |
|---|---|---|---|---|---|---|---|---|
| Example | 1 | Comparative example 1 | 1.05 | 1.28 | 0.22 | 0.24 | ○ | ○ |
| | 2 | Comparative example 1 | 1.16 | 1.40 | 0.17 | 0.21 | ○ | ○ |
| | 3 | Comparative example 3 | 1.23 | 1.34 | 0.16 | 0.17 | ○ | ○ |
| | 4 | Comparative example 4 | 1.22 | 1.51 | 0.19 | 0.18 | ○ | ○ |
| | 5 | Comparative example 5 | 1.07 | 1.28 | 0.24 | 0.19 | ○ | ○ |
| | 6 | Comparative example 6 | 1.05 | 1.26 | 0.22 | 0.25 | ○ | ○ |
| Comparative example | 1 | — | 1.00# | 1.00# | 0.19 | 0.24 | ○ | ○ |
| | 2 | Comparative example 1 | 1.02# | 1.00# | 0.13 | 0.13 | ○ | ○ |
| | 3 | — | 1.00# | 1.00# | 0.22 | 0.22 | ○ | ○ |
| | 4 | — | 1.00# | 1.00# | 0.11 | 0.15 | ○ | ○ |
| | 5 | — | 1.00# | 1.00# | 0.19 | 0.20 | ○ | ○ |
| | 6 | — | 1.00# | 1.00# | 0.19 | 0.24 | ○ | ○ |
| | 7 | Comparative example 6 | 1.27 | 1.40 | 0.25 | 0.25 | ○ | ○ |
| | 8 | Comparative example 6 | 1.14 | 1.25 | 0.15 | 0.23 | ○ | ○ |
| | 9 | — | 1.00# | 1.00# | 0.25 | 0.28 | ○ | ○ |
| | 10 | — | 1.00# | 1.00# | 0.29 | 0.30 | ○ | ○ |
| | 11 | — | (No evaluation: unable to form square micro-holes) | | | | | |
| | 12 | — | (No evaluation: unable to form square micro-holes) | | | | | |

#It means that it does not have the performance desired in the present invention.

TABLE 4

| Classification | | Composition (mass %): Main composition $Si_3N_4$ | $ZrO_2$ | SiC | AlN | Others | SiC + AlN Total | Oxide 1: MgO | $Y_2O_3$ | $CeO_2$ | Oxide 2: $Al_2O_3$ | $SiO_2$ | $TiO_2$ | $MoO_3$ | Total | Fn | SiC powder average particle size (μm) | AlN powder average particle size (μm) |
|---|---|---|---|---|---|---|---|---|---|---|---|---|---|---|---|---|---|---|
| Example | 7 | 37.9 | 47.9 | 7.4 | — | — | 7.4 | 0.9 | 3.7 | — | 1.9 | — | 0.3 | — | 6.8 | 0.09 | 0.53 | — |
| | 8 | 37.9 | 47.9 | 7.4 | — | — | 7.4 | 0.9 | 3.7 | — | 1.9 | — | 0.3 | — | 6.8 | 0.09 | 1.15 | — |
| | 9 | 50.8 | 28.9 | 4.1 | 8.2 | — | 12.3 | 1.4 | 3.3 | — | 2.5 | 0.5 | 0.3 | — | 8.0 | 0.36 | 0.53 | 0.86 |
| | 10 | 37.9 | 47.9 | 7.4 | — | — | 7.4 | 0.9 | 3.7 | — | 1.9 | — | 0.3 | — | 6.8 | 0.09 | 3.63 | — |
| | 11 | 50.8 | 28.9 | 4.1 | 8.2 | — | 12.3 | 1.4 | 3.3 | — | 2.5 | 0.5 | 0.3 | — | 8.0 | 0.36 | 1.15 | 4.40 |

TABLE 5

| Classification | | SiC average grain size (μm) | AlN average grain size (μm) | Coefficient of Thermal Expansion ($\times 10^{-6}$/° C.) | Flexural Strength (MPa) | Relative Density (%) |
|---|---|---|---|---|---|---|
| Example | 7 | 1.66 | — | 3.8 | 866 | 97.8 |
| | 8 | 2.52 | — | 3.7 | 744 | 97.3 |
| | 9 | 1.74 | 1.96 | 3.4 | 739 | 96.8 |
| | 10 | 4.11 | — | 3.7 | 666 | 96.3 |
| | 11 | 2.69 | 4.86 | 3.2 | 629 | 95.7 |

As shown in Tables 1 and 2, in Examples 1 to 6 satisfying all the conditions of the present invention, various performances were excellent. In particular, Examples 1 to 6 have a processing speed ratio of 1.05 or more as compared with their respective standard compositions (compositions in which the ratios of $Si_3N_4$ and $ZrO_2$ are the same), which is excellent. The effect of the present invention is confirmed. On the other hand, in Comparative Examples 1 to 12, the contents of SiC and AlN were out of the range specified in the present invention and did not satisfy the desired performance.

As shown in Tables 3 and 4, Examples 7 to 11 of the present invention are ceramic sintered bodies using one or more of SiC and AlN as raw material powders having various particle sizes. As shown in Examples 7 to 11 of the present invention, there is a tendency that the smaller the average particle size of SiC and AlN in the ceramic sintered body, the higher the flexural strength.

INDUSTRIAL APPLICABILITY

According to the present invention, the coefficient of thermal expansion similar to that of silicon, excellent mechanical strength and workability (high-precision fine processing, excellent processing surface texture, suppression of particle generation), and high-efficiency laser processing are achieved. Since possible ceramic can be obtained, it is particularly useful as a probe guiding member, probe card and inspection socket.

The invention claimed is:

1. A ceramic containing, in mass %:

$Si_3N_4$: 20.0 to 60.0%, $ZrO_2$: 25.0 to 70.0%, at least one selected from SiC and AlN: 2.0 to 17.0%, where AlN is 10.0% or less, at least one selected from MgO, $Y_2O_3$, $CeO_2$, CaO, $HfO_2$, $TiO_2$, $Al_2O_3$, $SiO_2$, $MoO_3$, CrO, CoO, ZnO, $Ga_2O_3$, $Ta_2O_5$, NiO and $V_2O_5$: 5.0 to 15.0%, wherein at least one selected from MgO, $Y_2O_3$, $CeO_2$, CaO and $HfO_2$, and at least one selected from $TiO_2$, $Al_2O_3$, $SiO_2$, $MoO_3$, CrO, CoO, ZnO, $Ga_2O_3$, $Ta_2O_5$, NiO and $V_2O_5$, and wherein Fn calculated from the following equation (1) satisfies 0.02 to 0.40, $$Fn=(SiC+3AlN)/(Si_3N_4+ZrO_2) \quad (1).$$

2. A ceramic containing, in mass %:

$Si_3N_4$: 20.0 to 60.0%, $ZrO_2$: 25.0 to 70.0%, at least one selected from SiC and AlN: 2.0 to 17.0%, where AlN is 10.0% or less, at least one selected from MgO, $Y_2O_3$, $CeO_2$, CaO, $HfO_2$, $TiO_2$, $Al_2O_3$, $SiO_2$, $MoO_3$, CrO, CoO, ZnO, $Ga_2O_3$, $Ta_2O_5$, NiO and $V_2O_5$: 5.0 to 15.0%, a crystal phase of $ZrO_2$ is one of a crystal phase being a tetragonal crystal, a crystal phase being a tetragonal crystal and a monoclinic crystal, a crystal phase being a cubic crystal, a crystal phase being a cubic crystal and a tetragonal crystal, and a crystal phase being a cubic crystal and a monoclinic crystal, wherein Fn calculated from the following equation (1) satisfies 0.02 to 0.40, $$Fn=(SiC+3AlN)/(Si_3N_4+ZrO_2) \quad (1).$$

3. The ceramic according to claim 1, wherein a crystal phase of $ZrO_2$ is a cubic crystal.

4. The ceramic according to claim 1, wherein the ceramic has a coefficient of thermal expansion at −50 to 500° C. ranging from $3.0\times10^{-6}$ to $6.0\times 10^{-6}$/° C. and has a three-point flexural strength of 600 MPa or more.

5. A probe guiding member that guides probes of a probe card, the probe guiding member comprising:

a plate-shaped main body that is made of the ceramic according to claim 1; and the plate shaped main body includes a plurality of through holes and/or slits through which the probes are to be inserted.

6. The probe guiding member according to claim 5, wherein a surface roughness of inner surfaces of the plurality of through holes and/or slits is 0.25 μm or less in terms of Ra.

7. The probe guiding member according to claim 5, wherein a diameter of an inscribed circle of the through hole and/or the slit is 100 μm or less.

8. The probe guiding member according to claim 5, wherein a ratio D/H is 6.0 or more, where D means a depth of the through hole and/or the slit and H means a diameter of an inscribed circle of the through hole and/or the slit.

9. A probe card comprising:

a plurality of probes; and the probe guiding member according to claim 5.

10. A socket for package inspection, wherein the socket for package inspection is made of the ceramic according to claim 1.

11. The ceramic according to claim 2, wherein a crystal phase of $ZrO_2$ is a cubic crystal.

12. The ceramic according to claim 3, wherein the ceramic has a coefficient of thermal expansion at −50 to 500° C. ranging from $3.0\times10^{-6}$ to $6.0\times10^{-6}$/° C. and has a three-point flexural strength of 600 MPa or more.

13. A probe guiding member that guides probes of a probe card, the probe guiding member comprising:

a plate-shaped main body that is made of the ceramic according to claim 2; and the plate shaped main body includes a plurality of through holes and/or slits through which the probes are to be inserted.

14. The probe guiding member according to claim 13, wherein a surface roughness of inner surfaces of the plurality of through holes and/or slits is 0.25 μm or less in terms of Ra.

15. The probe guiding member according to claim 13, wherein a diameter of an inscribed circle of the through hole and/or the slit is 100 μm or less.

16. The probe guiding member according to claim 13, wherein a ratio D/H is 6.0 or more, where D means a depth of the through hole and/or the slit and H means a diameter of an inscribed circle of the through hole and/or the slit.

17. A probe card comprising:

a plurality of probes; and the probe guiding member according to claim 13.

18. A socket for package inspection, wherein the socket for package inspection is made of the ceramic according to claim 2.

* * * * *